(12) United States Patent
Parvathala et al.

(10) Patent No.: US 6,948,096 B2
(45) Date of Patent: Sep. 20, 2005

(54) FUNCTIONAL RANDOM INSTRUCTION TESTING (FRIT) METHOD FOR COMPLEX DEVICES SUCH AS MICROPROCESSORS

(75) Inventors: Praveen K. Parvathala, Phoenix, AZ (US); Kailasnath Maneparambil, Chandler, AZ (US); William C. Lindsay, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 620 days.

(21) Appl. No.: 09/917,661

(22) Filed: Jul. 31, 2001

(65) Prior Publication Data

US 2003/0066003 A1 Apr. 3, 2003

(51) Int. Cl.[7] .......................... G06F 11/00; G01R 31/28
(52) U.S. Cl. ........................................ 714/30; 714/733
(58) Field of Search ............................... 714/25, 28–30, 714/32, 42, 43, 718, 724, 726, 728, 732–739, 741–743; 365/49, 201; 702/22, 117, 118, 120, 121; 324/73.1, 760, 158.1, 765

(56) References Cited

U.S. PATENT DOCUMENTS

| | | | | |
|---|---|---|---|---|
| 5,668,815 | A | * | 9/1997 | Gittinger et al. ............ 714/719 |
| 5,732,209 | A | * | 3/1998 | Vigil et al. .................... 714/30 |
| 6,578,169 | B1 | * | 6/2003 | Le et al. ....................... 714/736 |
| 2002/0093356 | A1 | * | 7/2002 | Williams et al. ............. 324/765 |

OTHER PUBLICATIONS

Native mode functional test generation for processors with applications to self test and design validation; Jian Shen; Abraham, J.A.; Test Conference, Proceedings. International, Oct. 18–23, 1998; pp.: 990–999□□.*
Shen et al., Native Mode Functional Test Generation for Processors with Applications to Self Test and Design Validation, Test Conference, Proceedings. International, Oct. 18–23, 1998, Page(s): 990–999 □□.*
Chen et al., Software–Based Self–Testing Methodology for Processor Cores, Mar. 2001, vol.: 20 , Issue: 3, On page(s): 369–380.*

* cited by examiner

Primary Examiner—Albert Decady
Assistant Examiner—John J. Tabone, Jr.
(74) Attorney, Agent, or Firm—LeMoine Patent Services, PLLC

(57) ABSTRACT

A functional random instruction testing (FRIT) method is provided for testing complex devices. The method comprises the steps of: generating a FRIT kernel which includes a software built-in self-test engine (SBE) configured to execute a re-generative functional test of the complex device under test (DUT), and an expected test result obtained from computer modeling of a complex device under test (DUT) or from a known good device; converting the FRIT kernel into kernel test patterns and storing the kernel test patterns in a tester memory; loading, at the tester, the kernel test patterns stored in the tester memory onto an on-board memory of the complex device under test (DUT), via an interface; executing, at the complex device under test (DUT), a re-generative functional test of the complex device under test (DUT) by applying the kernel test patterns to the complex device under test (DUT); and comparing, at the tester, a test result of the re-generative functional test with a test expected result to check for manufacturing defects.

20 Claims, 6 Drawing Sheets

FUNCTIONAL RANDOM INSTRUCTION TESTING (FRIT) METHOD FOR COMPLEX DEVICES SUCH AS MICROPROCESSORS

TECHNICAL FIELD

The present invention relates to the manufacture and functional testing of complex devices such as microprocessors, and more particularly, relates to a functional random instruction testing (FRIT) method for on-chip generation and application of functional tests.

BACKGROUND

Application specific integrated circuit (ASIC) technology has undergone rapid changes in recent years. Current ASIC chips may include functional blocks, such as microprocessors, interfaces, memory arrays, and DSPs (digital signal processors) all of which need to be validated for designs and tested for manufacturing defects.

Microprocessor testing is typically considered one of the most complex problems in ASIC testing, whether the microprocessor happens to be an ASIC core or a stand-alone device. This is because modern microprocessors are highly complex and typically enhanced with additional operating modes and features. For example, newer x86 microprocessors such as Pentium® processors as marketed by Intel® Corporation are designed to maintain software compatibility with previous 80x86 microprocessor generations (e.g., 8086/8, 80286, 80386, and 80486). These newer x86 microprocessors include multiple operating modes and are equipped with cache memory systems and added hardware support features for operation in multi-processor environments. Errors in the designs of microprocessors and defects introduced during manufacturing may cause the microprocessors to produce incorrect results during operation.

Traditionally functional tests have been used to ensure that complex devices such as microprocessors under test produce correct results in all possible operating environments. Functional tests are manually written by software designers/programmers or are generated by random instruction test (RIT) tools as described, for example, in the "*Native Mode Functional Test Generation For Processors With Applications To Self Test and Design Validation*" by Jian Shen and Jacobs A. Abraham of the Computer Engineering Research Center, University of Texas, IEEE International Test Conference, pp. 990–999, August 1998. In general, these functional tests include software instructions which cause a microprocessor under test to perform a desired activity and to produce a test result. The test result is compared with an expected test result derived from a functional specification of the microprocessor under test. Any difference between the test result produced by the microprocessor under test and the expected test result represents a failure of the functional test. Such a functional test failure may indicate improper microprocessor operation due to a design error or a manufacturing defect.

However, manual development of functional tests is very costly in terms of the (human) resources needed. Likewise, RIT tests are not very efficient in terms of high fault coverage and, often, require higher test data volume. Moreover, functional tests are performed by automatic test equipments (ATE) such as IC testers which require expensive, high performance pattern memory sub-systems to deliver complex test patterns. Since complex devices such as microprocessors have dramatically improved their performance, such as operating speeds, density, functionality, and pin counts, an IC tester for testing such microprocessors needs to be very large scale, high speed, and accordingly very expensive. For example, such an IC tester has several hundreds or more test pins (test channels), each of which includes a pattern generator, a timing generator and a frame processor, resulting in a very large and high cost system.

Due to high equipment costs and test generation costs inherent to functional tests, the semiconductor industry has adopted various design-for-test (DFT) techniques and built-in self-test (BIST) schemes such as scan, partial scan, logic BIST, scan-based BIST to structurally test various logic blocks within a microprocessor, via low cost IC testers. The main problem in these structural test approaches is the requirement of large amount of test data and additional hardware area (extra logic circuits) to implement the test logic. In addition, these test schemes also cause a 5–10% performance penalty. Typically, such a performance penalty is a signal propagation delay in the microprocessor because of the additional hardware overhead in the microprocessor. Thus, the design-for-test and built-in self-test schemes may adversely affect the microprocessor's performance, such as an operating speed because of the signal propagation delays. In addition, the collateral coverage from application of structural tests may be more limited compared to that achieved through the application of functional patterns.

Therefore there is need to develop test techniques that (a) enable automated random test generation in real time (b) are functional test based (c) can be applied on low cost structural testers and (d) are inexpensive to implement in silicon and (e) achieve high collateral coverage with at-speed test application, thus avoiding delay defect screening issues.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein.

DETAILED DESCRIPTION

The present invention is applicable to the testing of microprocessors, complex digital systems, and chipsets and new chipsets having memory and logic components incorporated therein which may become available as computer technology develops in the future. In addition, testing can be conducted on automated test equipment such as low cost testers, functional testers or even computer systems. The present invention is also applicable to the testing of one or more complex devices such as microprocessors integrated on one or more chipsets on board. However, for the sake of simplicity, discussions will concentrate mainly on random instruction testing of a single complex device such as a microprocessor, although the scope of the present invention is not limited thereto.

Figure 1:
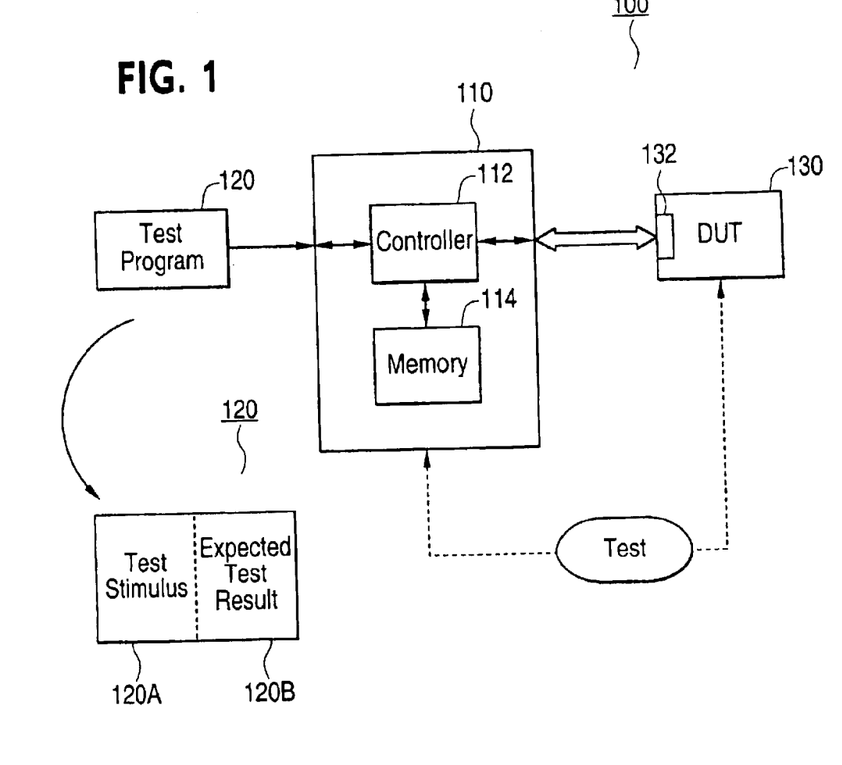
FIG. 1 illustrates an example test system for testing a complex device such as a microprocessor for manufacturing defect(s)

Attention now is directed to the drawings and particularly to FIG. 1, an example test system 100 may include an automated test equipment (ATE) such as a tester 110 utilized for testing a complex device such as a microprocessor under test (DUT) 130, via test programs 120, for manufacturing defect(s). Each test program 120 may include a test stimulus 120A and an expected test result (expected response) 120B. The test stimulus 120 may correspond to a software program manually written by designers/programmers or a software program generated by traditional random instruction test (RIT) tools for executing a functional test of a complex device such as a microprocessor under test (DUT) 130. The expected test result 120B is an expected response of a complex device under test (DUT) 130 computed based on a computer model of the same complex device under test (DUT) 130.

Generally, a simulation software and a simulation model are utilized by a computer system (not shown) for computing the expected response of a complex device under test (DUT) 130. The simulation model may indicate a software representation of a complex device under test (DUT) 130, and may be written using hardware description languages such as Verilog or VHDL, and may be provided on a computer tangible medium, such as memory devices; magnetic disks (fixed, floppy, and removable); other magnetic media such as magnetic tapes; optical media such as CD-ROM disks, or via Internet downloads, which may be available for plug-in or download into an existing operating system (OS) for computing the expected response of a complex device under test (DUT) 130.

As shown in FIG. 1, the tester 110 may include, but not limited to, a controller 112 and a memory 114. The controller 112 may be arranged to receive one or more test programs 120 in tester format and store test patterns into the tester memory 114. The controller 112 may then execute the test program 120 by applying the test patterns to the complex device under test (DUT) 130, via an interface 132, to check for manufacturing defects.

Figure 2:
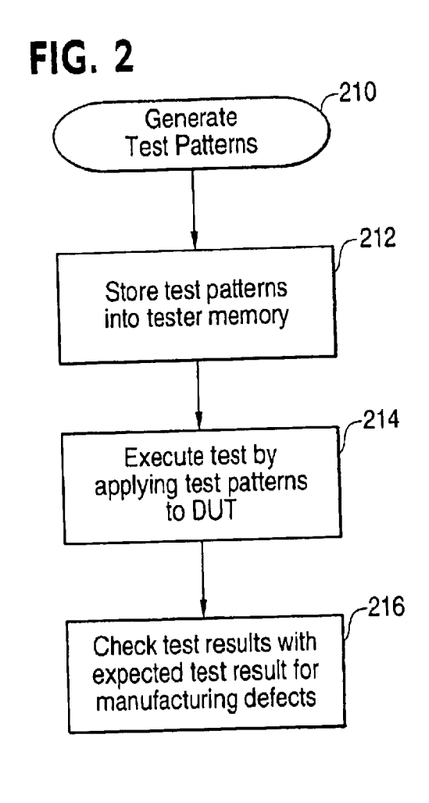
FIG. 2 illustrates an example flow diagram of an example test procedure.

FIG. 2 illustrates an example test procedure of the test system 100 shown in FIG. 1. At block 210, a test program 120 is generated and converted into a tester format (i.e., tester patterns). As described with reference to FIG. 1, the test program 120 includes a test stimulus 120A configured for executing a functional test which tests the functionality of a complex device under test (DUT) 130 or structural test which tests the structure of a complex device under test (DUT) 130, and a test expected result (expected response) 120B computed from the computer modeling of a complex device under test (DUT) 130. The controller 112 of the tester 110 may then store the test patterns in the tester memory 114. Next, the controller 112 of the tester 110 may execute the test program 120 by applying the test patterns stored in the tester memory 114 to the complex device under test (DUT) 130, via the interface 132, at block 214. The controller 112 of the tester 110 may then check the test result from the complex device under test (DUT) 130 with the expected test result (expected response) from the tester memory 114 in order to check for manufacturing defects at block 216.

Test programs 120 configured for functional tests have been commonly used to ensure that complex devices such as microprocessors produce correct results in all possible operating environments and indicate improper microprocessor operation due to design errors or manufacturing defects. However, functional tests are very costly in terms of the (human) resources needed. Random Instruction Test (RIT) tools may be used to generate functional tests, but are not very efficient in terms of high fault coverage and, often, require higher test data volume on a host computer under an operating system (OS). In addition, RIT tool generated functional tests for testing the functionality of complex devices such as microprocessors often generate conditions that cause shutdown and infinite loops. Both manually developed functional tests and RIT tool generated functional tests require high cost tester 110 where the cost is driven by the need for high speed electronics and high pin count.

Due to high equipment costs and test generation costs inherent to functional tests, various design-for-test (DFT) techniques and built-in self-test (BIST) schemes such as scan, partial scan, logic BIST, scan-based BIST may be utilized to structurally test various logic blocks within a microprocessor, via low cost tester 110 without the need for high pin count and high speed test. As a result, test programs 120 configured for structural tests have been recently used to indicate improper microprocessor operation due to design errors or manufacturing defects. Structural tests may be generated by scan automatic test pattern generation (ATPG) tools and executed in the same manner described with reference to FIG. 2.

The main problem in these structural test approaches is the requirement of large amount of test data and additional hardware area (extra logic circuits) to implement the test logic. This is because test patterns are serially shifted into the microprocessor at slow speeds which can be very costly in terms of test time. In addition, these test schemes also cause a 5–10% performance penalty, typically, in a signal propagation delay. For example, in the scan implementation, each flip-flop circuit in the microprocessor is preceded by a selector (multiplexer) to selectively provide the flip-flop either a scan-in signal or a normal signal. Such an additional selector causes a delay time in the overall performance of the flip-flop circuit. Thus, the design-for-test (DFT) and built-in self-test (BIST) schemes may adversely affect the microprocessor's performance, such as an operating speed because of the signal propagation delays. Moreover, the collateral coverage from application of structural tests may be more limited compared to that achieved through the application of functional patterns.

Figure 3:
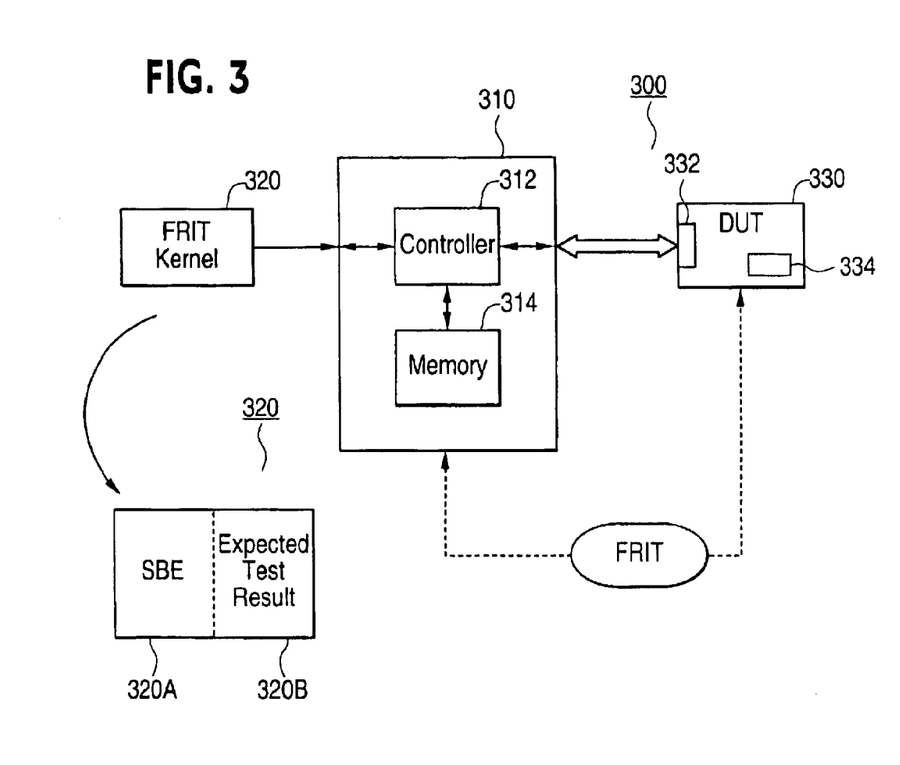
FIG. 3 illustrates an example test system for testing a complex device such as a microprocessor for manufacturing defects, via an example functional random instruction test (FRIT) kernel according to an embodiment of the present invention.

Turning now to FIG. 3, an example test system for testing a complex device such as a microprocessor under test for manufacturing defects, via an example functional random instruction test (FRIT) kernel according to an embodiment of the present invention is illustrated. The new functional random instruction test (FRIT) method advantageously enables automated test generation in real time that is functional test based at speed and inexpensive to implement in silicon, and can be applied on low cost structural testers in order to achieve high collateral coverage while avoiding delay defect screening issues. The functional random instruction test (FRIT) method is intended to address the following concerns: (1) the test generation cost issue associated with manual functional test development; (2) the test data volume issue related to RIT tool generated functional tests; (3) the test cost issue by enabling functional tests to be run on low cost structural tests; (4) the test data volume issues on structural testers associates with scan testing; (5) the delay defect screening issues associated with scan testing. Further, since functional patterns are generated and applied at system clock speed, the collateral coverage is very high and, as a result, the defect screening ability of the functional random instruction test (FRIT) method is much superior compared to the structural test methods in use to date. At-speed functional tests can be executed on low cost automated test equipments (ATE) such as low cost testers and delay defects can be identified.

As shown in FIG. 3, the example test system 300 may include a low cost tester 310 utilized for testing a complex device such as a microprocessor under test (DUT) 330, via an especially programmed functional random instruction test (FRIT) kernel 320, for manufacturing defect(s). A FRIT kernel 320 is a software programmed to provide a special re-generative capability. Essentially, the FRIT kernel 320 is a special functional test (sequence of instructions)—a test which generates one or more tests in real time when loaded on-board a complex device such as a microprocessor under test (DUT) 330. When loaded on-board a complex device such as a microprocessor under test (DUT) 330, the FRIT kernel 320 will activate the complex device under test (DUT) 330 to generate and execute its own functional test sequences in real time.

The FRIT kernel 320 may include a software built-in, self-test (BIST) engine (SBE) 320A configured to repeatedly generate and execute functional tests of a complex device under test (DUT) 330, and an expected test result (expected response) 320B computed based on a computer model of the same complex device under test (DUT) 130. The SBE 320A of the FRIT kernel 320 may operate independently from any operating system (OS) and may include an environment to store and run the re-generative functional test. The SBE 320A of the FRIT kernel 320 may be written in any computer language such as C or C++ code language, and may be provided on a computer tangible medium, such as memory devices; magnetic disks (fixed, floppy, and removable); other magnetic media such as magnetic tapes; optical media such as CD-ROM disks, or via Internet downloads, which may be available for plug-in or download into the controller 312 of the tester 310 for executing random functional instructions (machine code). In addition, the expected test result (expected response) 320B may be obtained by alternative techniques. For example, one technique to generate the expected response is to run the re-generative functional test on a good device first and then use the test results of a known good device to construct the expected response.

As shown in FIG. 3, the low-cost tester 310 may include, but not limited to, a controller 312 and a memory 314. The complex device under test (DUT) 330 may contain an interface 332 that requires only a few pins, and an on-board memory (e.g., cache) 334 that is used to store the FRIT kernel 320. The controller 312 of the tester 310 may be arranged to receive and store at least a FRIT kernel 320, including the SBE 320A and the test expected result (expected response) 320B into the tester memory 314. The controller 312 may then load the kernel test patterns (SBE) into on-board memory 334 of the complex device under test (DUT) 330, via an interface 332. Once loaded on-board memory 334 of the complex device under test (DUT) 330, the kernel test patterns (SBE) are activated and applied to the complex device under test (DUT) 330. The test result (device response) may be unloaded from the on-board memory 334 of the complex device under test (DUT) 330 and delivered back to the controller 312 of the low-cost tester 310, via an interface 332. The controller 312 of the low-cost tester 310 may then compare the test result from the on-board memory 334 of the complex device under test (DUT) 330 with the test expected result 320B stored in the tester memory 314 in order to check for manufacturing defects. In another embodiment of the present invention, the test result from the complex device under test (DUT) 330 may be sent directly to the tester 310, via the interface 332, without first being stored in the on-board memory 334. At the tester 310, the test result may be compared directly with the test expected result (expected response) 320B for manufacturing defects.

Figure 4:
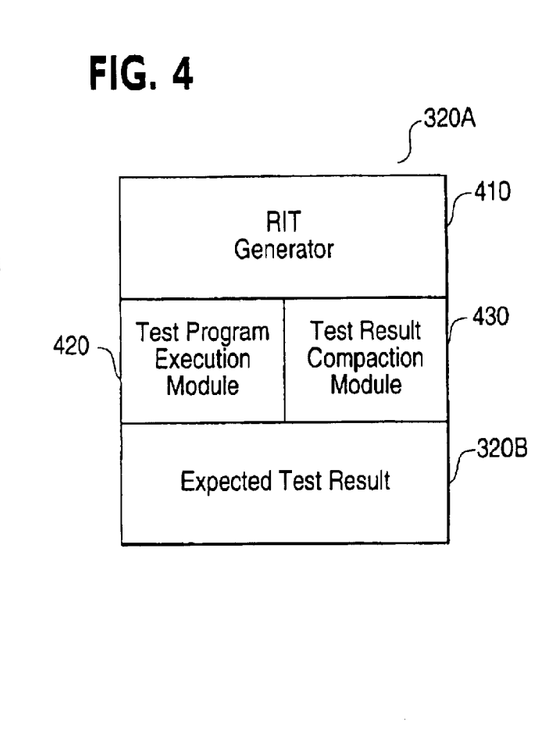
FIG. 4 illustrates an example functional random instruction test (FRIT) kernel according to an embodiment of the present invention.

As shown in FIG. 4, the software BIST engine (SBE) 320A of the FRIT kernel 320 contains three (3) components: a RIT generator 410, a test program execution module 420, and a test result compaction module 430. The RIT generator 410 is a software configured with compact RIT machine code that can reside in the on-board memory 334 of the complex device under test (DUT) 330 for generating functional test sequences. The test program execution module 420 is a software that contains test execution directives for providing an environment to store and run the re-generated functional test (sequence of instructions). The test execution environment ensures that no memory access outside the complex device under test (DUT) may take place. The test execution environment may also employ an exception handler for handling illegal/dangerous conditions such as undesirable memory accesses, deadlock, shut-down, infinite loops etc. Thus the test execution environment ensures that the complex device under test (DUT) 330 does not generate any bus cycles during test in order to eliminate the need for a high pin count interface to the tester 310. The test result compaction module 430 is a software that compresses test results for storage in the on-board memory 334 of the complex device under test (DUT) 330. Alternatively, the test result compaction module 430 may correspond to a hardware integrated on-board as part of the complex device under test (DUT) 330 for test result compression.

Figure 5:
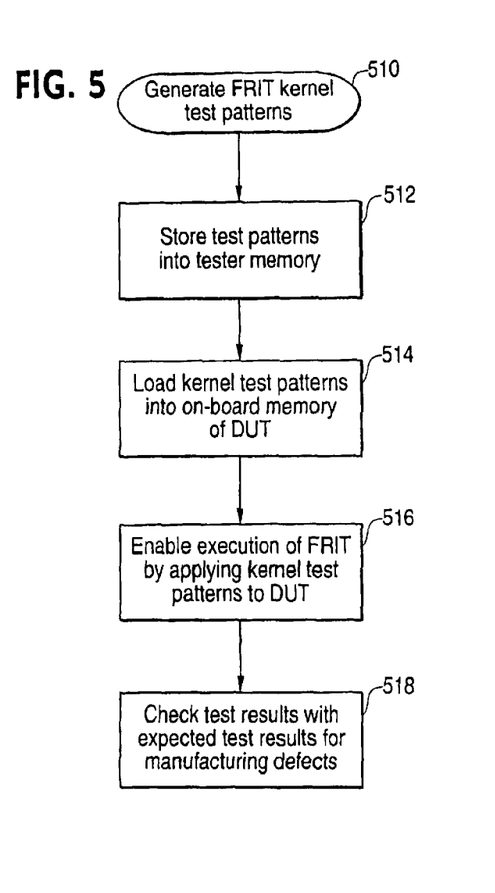
FIG. 5 illustrates a flow diagram of an example functional random instruction test (FRIT) application according to an embodiment of the present invention.

Referring now to FIG. 5, an example test procedure of the test system 300 according to an embodiment of the present invention is illustrated. At block 510, the FRIT kernel 320 is generated and converted into a test format (i.e., kernel test patterns). As described with reference to FIG. 3, the FRIT kernel 320 contains a SBE 320A configured for executing the functional test sequences which test the functionality of a complex device under test (DUT) 330, and a test expected result (expected response) 320B computed from the computer modeling of the same complex device under test (DUT) 330 or from a known good device.

The controller 312 of the low-cost tester 310 may then receive and store the kernel test patterns in the tester memory 314. Next, the controller 312 of the low cost tester 110 may then load the kernel test patterns (SBE "320A")

into on-board memory 334 of the complex device under test (DUT) 330, via an interface 332 at block 514. Once loaded into the on-board memory 334 of the complex device under test (DUT) 330, the controller 312 of the low cost tester 310 may enable execution of the kernel test patterns (SBE "320A"), that is, the kernel test patterns (SBE "320A") may be automatically activated and repeatedly applied to the complex device under test (DUT) 330 at block 516. The test result may store in the on-board memory 334 of the complex device under test (DUT) 330. The controller 312 of the tester 310 may then unload the test result (device response) from the on-board memory 334 of the complex device under test (DUT) 330, via the interface 332, and compare the test result from the on-board memory 334 of the complex device under test (DUT) 330 with the test expected result 320B stored in the tester memory 314 in order to check for manufacturing defects at block 518.

Figure 6:
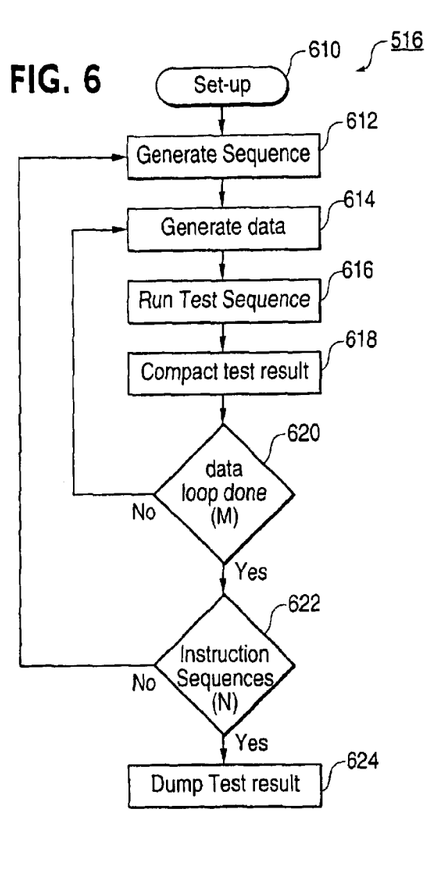
FIG. 6 illustrates a flow diagram of an example flow diagram of a functional random instruction test (FRIT) execution sequence according to an embodiment of the present invention.

FIG. 6 illustrates a flow diagram of an example functional random instruction test (FRIT) execution sequence according to an embodiment of the present invention. As shown in FIG. 6, after the kernel test patterns (SBE "320A") are applied to the complex device such as a microprocessor under test (DUT) 330 from the on-board memory 334, the microprocessor 330 may begin basic set-up at block 610. The kernel test patterns (SBE "320A") are then executed by the microprocessor 330 to generate a test sequence at block 612. Associated data for the test sequence may also be generated by the kernel test patterns (SBE "320A") at block 614. Once the test sequence and the associated data are generated, the microprocessor 330 may now run (execute) the test sequence at block 616. At the end of the test sequence, the test result may be obtained and compressed by way of the test result compaction module 430 of the kernel test patterns (SBE "320A") as shown in FIG. 4, for subsequently storage in the on-board memory 334 at block 618.

Referring now back to FIGS. 3–4, the SBE 320A of each FRIT kernel 320 may be programmed to generate one or more ("N") loops of test sequences, where N represents an integer no less than "1" and is a user-specified number used in generating the FRIT kernel 320 by an especially designed software tool. Each of these N test sequences may in turn employ one or more (M) different data sets. Therefore, if N is ten (10) and M is five (5) for example, then there may be ten (10) distinct instruction sequences executed, each being executed five (5) times on five (5) distinct data sets, and the test results of respective loops may be obtained, compressed and written back to the on-board memory 334. In addition, a signature may be generated to provide a unique identification of the test result of each test sequence and to indicate whether the test result of a particular test sequence is "good" or "bad". The resulting "signature" may then be stored in the on-board memory 334. The signatures of all (N times M) loops may make up the expected test result (expected response) of the complex device under test (DUT) 330.

After the test result of a particular test sequence is obtained and compressed for compaction, the microprocessor 330 may determine if all data sets (M) associated with a test sequence of a particular loop are completed or done at block 620. If all data sets associated with a test sequence of a particular loop are not completed or done, the microprocessor 330 may return to generate associated data at block 614 and continue to run the test sequence at block 616 until the test result is obtained and compressed at block 618. However, if the data sets associated with a test sequence are completed or done, the microprocessor 330 may determine if all ("N") instruction sequences are completed or done at block 622. If all instruction sequences (N) are not completed or done, the microprocessor 330 may return to generate a new test sequence at block 612, associated data of the new test sequence at block 614 and continue to run the test sequence at block 616 until the test result of the new test sequence is obtained and compressed at block 618. When all the N instruction loops and M data sets have been executed, i.e., N times M number of instruction sequences have been executed, the microprocessor 330 may dump the test results of the FRIT kernel 320 from the on-board memory 334 back to the low cost tester 310, via low pin interface 332.

Figure 7:
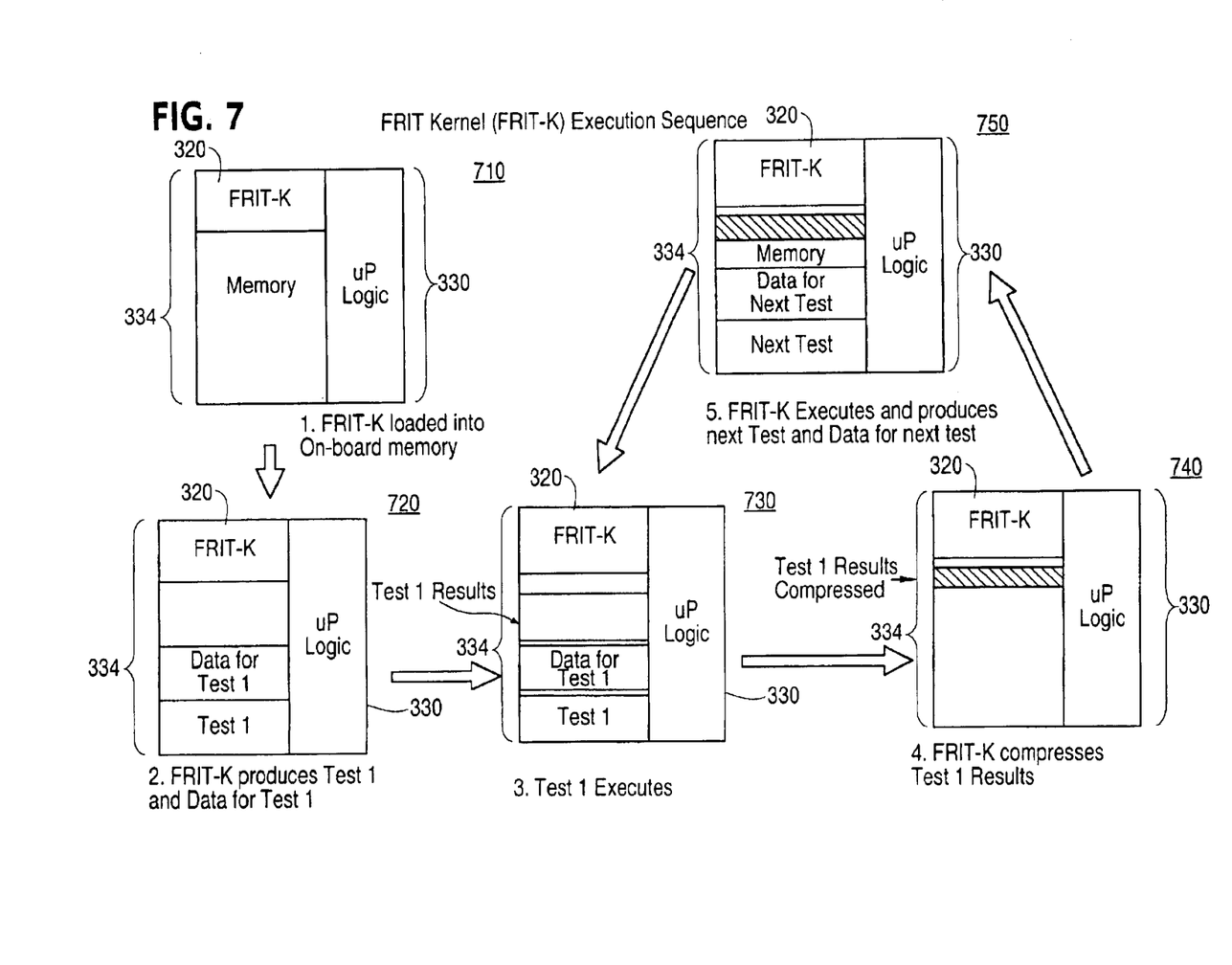
FIG. 7 illustrates a block diagram of an example functional random instruction test (FRIT) sequence execution according to an embodiment of the present invention.

FIG. 7 illustrates a block diagram of an example functional random instruction test (FRIT) execution sequence shown in FIG. 6. For simplicity, the data loops are not show in FIG. 7. Only instruction sequences are shown but are not limited thereto. FIG. 7 shows the case when M is one "1". At block 710, the FRIT kernel 320 is loaded into the on-board memory 334 of the microprocessor 330 under test. At block 720, the FRIT kernel 320 is executed by the microprocessor 330 to produce test sequence #1 and associated data for test sequence #1. At block 730, the test sequence #1 is executed by the microprocessor 330 to produce a test result #1, after the test sequence #1 and associated data for test sequence #1 are produced. At block 740, the test result #1 is compressed for compaction and is written into the on-board memory 334. At block 750, the FRIT kernel 320 is continued executed by the microprocessor 330 to produce a next test sequence, test sequence #2 for example, and associated data for test sequence #2 for test execution and subsequent test result compression until all test sequences are completed. The test results are then dumped out after several data loops of test generation/execution by the microprocessor 330 and transferred back to the tester memory 314 for comparison with the expected test result (expected response) 320B stored therein to check for manufacturing defects.

Figure 8:
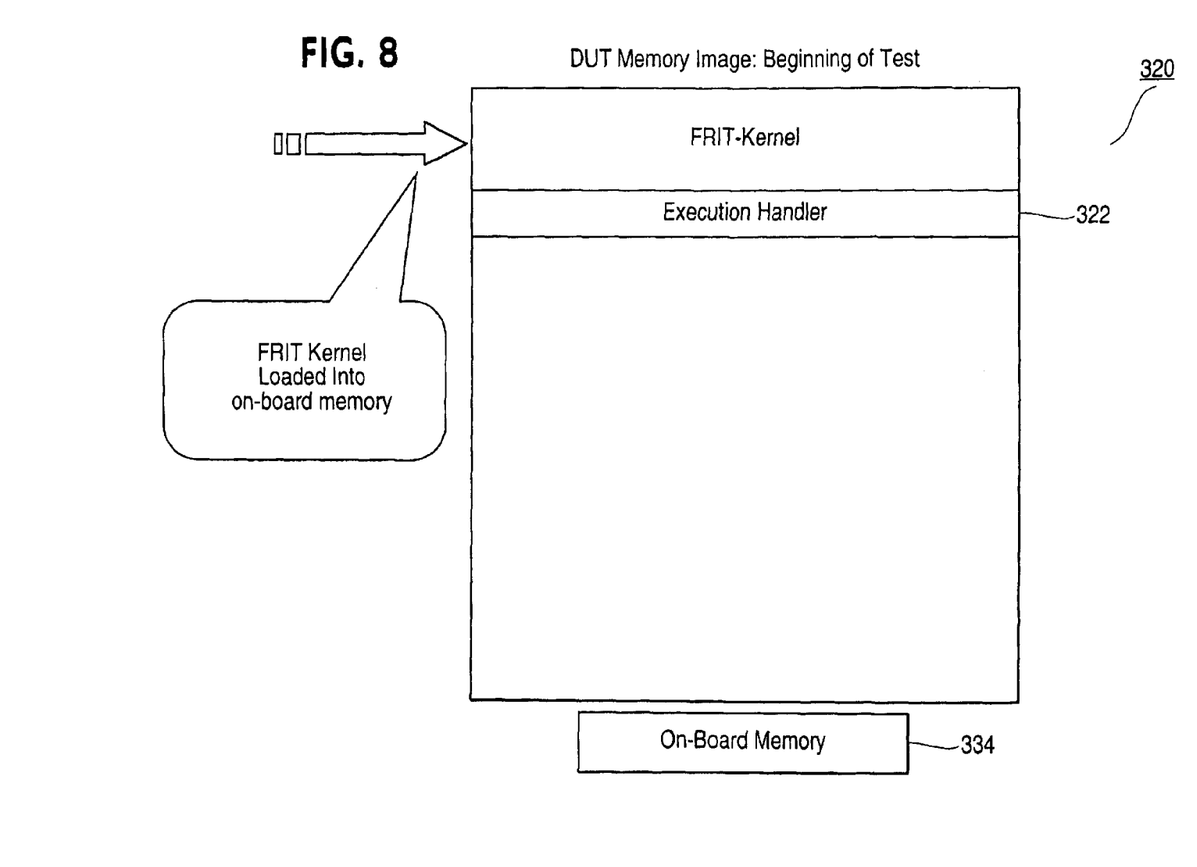
FIG. 8 illustrates an example memory image of a complex device such as a microprocessor under test (DUT) at the beginning of test according to an embodiment of the present invention.
Figure 9:
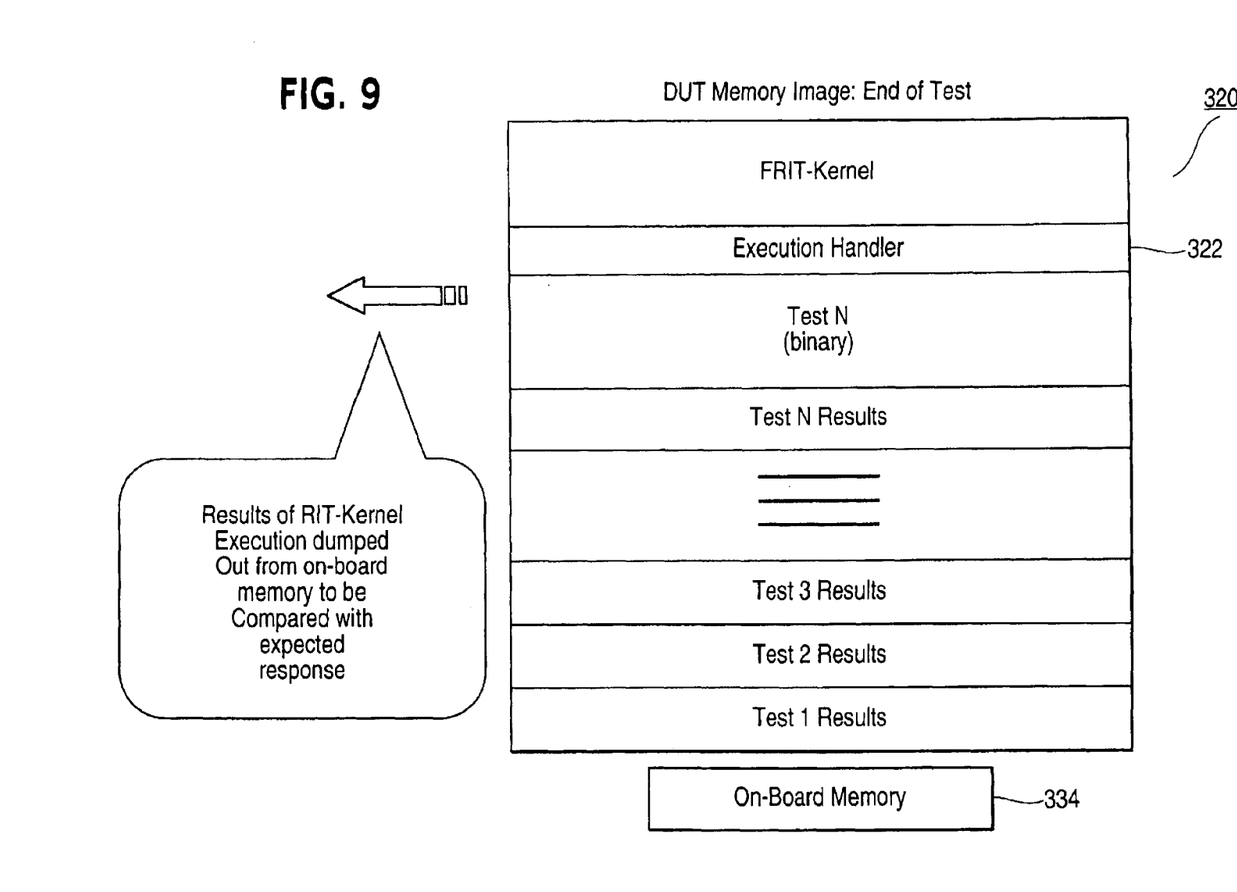
FIG. 9 illustrates an example memory image of a complex device such as a microprocessor under test (DUT) at the end of test according to an embodiment of the present invention.

FIGS. 8–9 illustrate an example memory image of a complex device such as a microprocessor under test (DUT) 330 at the beginning and at the end of a test according to an embodiment of the present invention. As shown in FIG. 8, the FRIT kernel test patterns 320 are loaded into the on-board memory 334 using, for example, a test access port (TAP) controller (not shown). The FRIT kernel 320 may also contain an exception handler 322 configured to handle illegal conditions during test (i.e., execution of the FRIT kernel 320).

As shown in FIG. 9, at the end of the test (i.e., execution of the FRIT kernel 320), all the test results of the complex device under test (DUT) 330 stored in the on-board memory 334 are dumped out from the on-board memory 334 to the controller 312 of the tester 310 where the test results are compared with the expected test result (expected response) 320B stored in the tester memory 314 in order to check for manufacturing defects.

As described from the foregoing, the FRIT kernel of the present invention advantageously enables automated test generation in real time that is functional test based at speed and inexpensive to implement in silicon, and can be applied on low cost structural testers in order to achieve high collateral coverage while avoiding delay defect screening issues. The FRIT kernel also allows a large number of tests to be applied without corresponding increase in test vector, that is, the increase in test data volume that exist with traditional RIT tools. The FRIT method offers tremendous benefits in containing the cost and ensuring quality of the microprocessors that are produced with practically no design changes and no silicon overhead. In addition, the FRIT kernel can be used at any test phase (SORT, Burn-In, Class) to reduce test data volume on the tester.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. For example, the testing system as shown in FIGS. 1 and 3 may be configured differently or employ some or different components than those illustrated without changing the basic function of the invention. In addition, the flow diagrams shown in FIGS. 5 and 6 may also be described differently without changing the basic function of the invention. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A functional random instruction testing (FRIT) method for testing a microprocessor, comprising:

converting a FRIT kernel into kernel test patterns and storing the kernel test patterns in a tester memory;

loading, at the tester, the kernel test patterns stored in the tester memory onto an on-board memory of the microprocessor to form the FRIT kernel in the on-board memory of the microprocessor, wherein the FRIT kernel includes a software built-in self-test engine (SBE);

executing by the microprocessor and from the on-board memory of the microprocessor, software within the FRIT kernel to repeatedly generate and execute functional tests to test the microprocessor; and comparing, at the tester, a test result of the functional tests with an expected test result to check for manufacturing defects.

2. The method as claimed in claim 1, wherein said FRIT kernel includes an expected test result obtained from computer modeling of the microprocessor.

3. The method as claimed in claim 2, wherein said software built-in self-test engine (SBE) of the FRIT kernel comprises;

a random instruction test (RIT) generator including compact RIT machine code residing in the on-board memory of the microprocessor for generating the functional tests;

a test program execution module including test execution directives for providing an environment to store and run the functional tests; and a test result compaction module including compression machine code to compress test results of the functional tests for storage in the on-board memory of the microprocessor.

4. The method as claimed in claim 3, wherein said test execution environment employs an exception handler for handling illegal conditions such as undesirable memory accesses, deadlock, shut-down, and infinite loops.

5. The method as claimed in claim 1, wherein, when software within the FRIT kernel is executed from the on-board memory, the microprocessor performs the following:

beginning a set-up for executing the software built-in self-test engine (SBE) within the FRIT kernel;

executing the software built-in self-test engine (SBE) to generate a series of test sequences and associated data for respective test sequences;

running the test sequences, and at the end of the test sequences, obtaining the test results for storage in the on-board memory; and dumping the test results, via an interface, for making a comparison with the expected test result to check for manufacturing defects.

6. The method as claimed in claim 5, wherein said FRIT kernel includes the expected test result obtained either from computer modeling of the microprocessor or from a known good device.

7. The method as claimed in claim 5, wherein said software built-in self-test engine (SBE) of the FRIT kernel is programmed to generate and execute one or more ("N") instruction sequences, each sequence being executed on one or more (M) data sets, where N and M represent an integer no less than "1" and are user-specified numbers used in generating the FRIT kernel.

8. The method as claimed in claim 7, wherein said software built-in self-test engine (SBE) of the FRIT kernel is further programmed to generate one or more signatures to provide a unique identification of the test result of each test sequence and indicate whether the test result of a particular test sequence is "good" or "bad".

9. A computer readable medium having instructions stored thereon which, when executed by a system, cause the system to perform:

receiving a functional random instruction test (FRIT) kernel as kernel test patterns and storing the kernel test patterns in a tester memory;

loading the kernel test patterns stored in the tester memory onto an on-board memory of a microprocessor to form the FRIT kernel in the on-board memory of the microprocessor, wherein the FRIT kernel includes a software built-in self-test engine (SBE);

enabling execution by the microprocessor and from the on-board memory of the microprocessor of software within the FRIT kernel to repeatedly generate and execute functional tests to test the microprocessor; and making a comparison between a test result of the functional tests and an expected test result to check for manufacturing defects.

10. The computer readable medium as claimed in claim 9, wherein said FRIT kernel includes the expected test result.

11. The computer readable medium as claimed in claim 9, wherein said expected test result is obtained from computer modeling of the microprocessor or from a known good device.

12. The computer readable medium as claimed in claim 9, wherein said software built-in self-test engine (SBE) of the FRIT kernel comprises:

a random instruction test (RIT) generator including compact RIT machine code in the on-board memory of the microprocessor for generating the functional tests a test program execution module including test execution directives for providing an environment to store and run the functional tests; and a test result compaction module including compression machine code to compress test results of the functional tests for storage in the on-board memory of the microprocessor.

13. The computer readable medium as claimed in claim 12, wherein said test execution environment employs an exception handler for handling illegal conditions such as undesirable memory accesses, deadlock, shut-down, and infinite loops.

14. The computer readable medium as claimed in claim 9, wherein, when software within the FRIT kernel is executed from the on-board memory, the microprocessor performs the following;

beginning a set-up for executing the software built-in self-test engine (SBE) within the FRIT kernel;

executing the software built-in self-test engine (SBE) to generate a series of test sequences and associated data for respective test sequences;

running the test sequences, and at the end of the test sequences, obtaining the test results for storage in the on-board memory; and dumping the test results to the testing system, via an interface, for making said comparison with the expected test result to check for manufacturing defects.

15. The computer readable medium as claimed in claim 9, wherein said software built-in self-test engine (SBE) of the FRIT kernel is programmed to generate and execute one or more ("N") instruction sequences, each sequence being executed on one or more (M) data sets where N and M represent an integer no less than "1" and are user-specified numbers used in generating the FRIT kernel.

16. The computer readable medium as claimed in claim 9, wherein said software built-in self-test engine (SBE) of the FRIT kernel is further programmed to generate one or more signatures to provide a unique identification of the test result of each test sequence and indicate whether the test result of a particular test sequence is "good" or "bad".

17. A test system for testing a microprocessor comprising:

a tester memory; and a controller to test a functionality of the microprocessor by:

receiving a functional random instruction test (FRIT) kernel as kernel test patterns and storing the kernel test patterns in the tester memory;

loading the kernel test patterns stored in the tester memory onto on-board memory of the microprocessor to form the FRIT kernel in the on-board memory of the microprocessor wherein the FRIT kernel includes a software built-in self-test engine (SBE);

enabling execution by the microprocessor and from the on-board memo of the microprocessor of software within the FRIT kernel to repeatedly generate and execute functional tests to test the microprocessor; and making a comparison between a test result of the functional tests and an expected test result to check for manufacturing defects.

18. The test system as claimed in claim 17, wherein said expected test result is obtained from computer modeling of the microprocessor or from a known good device.

19. The test system as claimed in claim 17, wherein said software built-in self-test engine (SBE) of the FRIT kernel comprises:

a random instruction test (RIT) generator including compact RIT machine code in the on-board memory of the microprocessor for generating the functional tests;

a test program execution module including test execution directives for providing an environment to store and run the functional tests; and a test result compaction module including compression machine code to compress test results of the functional tests for storage in the on-board memory of the microprocessor.

20. The test system as claimed in claim 19, wherein said test execution environment employs an exception handler for handling illegal conditions such as undesirable memory accesses, deadlock, shut-down, and infinite loops.

* * * * *

UNITED STATES PATENT AND TRADEMARK OFFICE
CERTIFICATE OF CORRECTION

PATENT NO.    : 6,948,096 B2
DATED         : September 20, 2005
INVENTOR(S)   : Parvathala, Praveen K.

It is certified that error appears in the above-identified patent and that said Letters Patent is hereby corrected as shown below:

Column 9,
Line 43, after "comprises" delete ";" and insert -- : --, therefor.

Column 10,
Line 51, after "tests" insert -- ; --.
Line 67, after "following" delete ";" and insert -- : --, therefor.

Column 11,
Line 25, after "microprocessor" insert -- , --.

Column 12,
Line 2, after "microprocessor" insert -- , --.
Line 5, delete "memo" and insert -- memory --, therefor.

Signed and Sealed this

Twentieth Day of December, 2005

JON W. DUDAS
*Director of the United States Patent and Trademark Office*